United States Patent [19]
Vasché

[11] Patent Number: 5,219,774
[45] Date of Patent: Jun. 15, 1993

[54] DEPOSITED TUNNELING OXIDE

[75] Inventor: Gregory S. Vasché, Los Gatos, Calif.

[73] Assignee: Xicor, Inc., Milpitas, Calif.

[21] Appl. No.: 545,122

[22] Filed: Jun. 26, 1990

Related U.S. Application Data

[63] Continuation of Ser. No. 195,766, May 17, 1988, abandoned.

[51] Int. Cl.$^5$ .................. H01L 21/285; H01L 29/788
[52] U.S. Cl. ........................ 437/43; 437/52; 437/238; 148/DIG. 118
[58] Field of Search .............. 437/43, 52, 238, 239, 437/235; 357/49, 23.5; 148/DIG. 118; 427/255.2, 255.3, 248.1

[56] References Cited

U.S. PATENT DOCUMENTS

| | | | |
|---|---|---|---|
| 3,934,060 | 1/1976 | Burt et al. | 437/243 |
| 4,526,631 | 7/1985 | Silvestri et al. | 437/238 |
| 4,599,706 | 7/1986 | Guterman | 365/185 |
| 4,613,956 | 9/1986 | Paterson et al. | 365/185 |
| 4,713,677 | 12/1987 | Tigelaar et al. | 357/23.5 |
| 4,720,323 | 1/1988 | Sato | 437/69 |
| 4,763,177 | 8/1988 | Paterson | 357/23.5 |

OTHER PUBLICATIONS

Dimaria et al., "High Current Injection into $SiO_2$ from Si Rich $SiO_2$ Films and Experimental Applications", J. Appl. Phys. vol. 51, No. 5, May 1980, pp. 2722-2735.
Pande et al., "A Novel Low-Temperature Method of $SiO_2$ Films Deposition for MOSFET Applications", J. Elect. Mat., vol. 13, No. 3, 1984, pp. 593-602.
Adams, A. C. and C. D. Capio, "The Deposition of Silicon Dioxide Films at Reduced Pressure", J. Electrochem. Soc., vol. 126, No. 6, Jun. 1979, pp. 1042-1046.
Wolf, Stanley and Richard N. Tauber, *Silicon Processing for the VLSI Era, vol. 1: Process Technology*, Lattice Press, 1986, pp. 182-185, 220-228.
Peek, H. L., "The Characterization and Technology of Deposited Oxides for EEPROM", in *Insulating Films on Semiconductors*, Verweij, J.F. and D. R. Wolters, eds., Elsevier Science Publishers B.V., 1983, pp. 261-265.
Rosler, Richard S., "Low Pressure CVD Production Processes for Poly, Nitride, and Oxide", Solid State Technology, Apr. 1977, pp. 63-70.
Wolf, *Silicon Processing for the VLSI Era, vol. 2, Process Integration*, Lattice Press, 1990.
F. S. Becker, et al., "Low-pressure deposition of high-quality $SiO_2$ films by pyrolysis of tetraethylorthosilicate," *Journal of Vacuum Science and Technology: Part B*, vol. 5, No. 6, Nov./Dec. 1987, pp. 1555-1563.

Primary Examiner—Mary Wilczewski
Attorney, Agent, or Firm—McCubbrey, Bartels, Meyer & Ward

[57] ABSTRACT

An apparatus and method for depositing a tunneling oxide layer between two conducting layers utilizing a low pressure, low temperature chemical vapor deposition (LPCVD) process is disclosed wherein tetraethylorthosilicate (TEOS) is preferably used. As applied to an electrically erasable programmable read only memory (EEPROM) device having polysilicon layers, the apparatus is constructed by forming a first layer of polysilicon, patterned as desired. A layer of silicon dioxide is then deposited by decomposition of TEOS to form the tunneling oxide to a predetermined thickness. If enhanced emission structures are desired, a layer of relatively thin tunneling oxide may be grown on the first layer of polysilicon. The oxide layer is then annealed and densified, preferably using steam and an inert gas at a specific temperature. A second layer of polysilicon is then formed on top of the tunneling oxide.

14 Claims, 3 Drawing Sheets

DEPOSITED TUNNELING OXIDE

This application is a continuation, of application Ser. No. 195,766 filed May 17, 1988, now abandoned.

FIELD OF THE INVENTION

This invention relates to the field of integrated circuit processing and more specifically to a method of depositing tunneling oxide in an electrically eraseable read-only memory device.

BACKGROUND OF THE INVENTION

EEPROM devices are nonvolatile memory devices in which the presence or absence of charge on a floating gate electrode indicates a binary one or zero. One EEPROM device is described in U.S. Pat. No. 4,599,606, entitled "Nonvolatile Electrically Alterable Memory". This patent is herein incorporated by reference. In this type of EEPROM device, the floating gate electrode is electrically insulated from the other electrodes of the device by one or more layers of tunneling oxide. Electrical charge is transferred to the floating gate by placing a voltage on a programming electrode which is sufficient to cause electrons to tunnel through the tunneling oxide to the floating gate electrode. In EEPROM devices, the tunneling oxide can conduct only a limited amount of charge under the high fields imposed across the oxide during tunneling before the tunneling oxide fails or breaks down, thus limiting the number of programming cycles. In some tunneling elements in an EEPROM array, this failure may occur in less than approximately 10,000 programming cycles, depending on the uniformity and intrinsic defect density of the tunneling oxide layer or layers.

The characteristics of the tunneling oxide layer are critical to the life and operation of an EEPROM device. In prior EEPROM devices, tunneling oxides are produced by growing an oxide using a thermal oxidation process. However, with this type of process, the oxide defect density is quite high, which causes a large number of early breakdown failures. As presently understood, this is because any defects in the underlying silicon may propagate into the silicon dioxide layer as it is grown. Furthermore, during the thermal oxidation process, the tunneling oxide develops a high level of stress. As presently understood, this phenomena causes defects resulting in early or premature failures in the oxide during tunneling, thus further limiting the life of the device. No technique is known for thermally growing a low-stress tunneling oxide, while providing an oxide layer with substantially zero defects.

SUMMARY OF THE INVENTION

Briefly described, the present invention contemplates a method and means of depositing a tunneling oxide layer between two conductors with a low pressure, low temperature chemical vapor deposition (LPCVD) process. Preferably, tetraethylorthosilicate (TEOS) is used for this deposition process. Where the present method is used in an EEPROM device and polysilicon layers are used for forming the device, the deposited oxide is formed as follows. According to the present invention, a first layer of polysilicon is deposited and patterned as desired. A layer of silicon dioxide is then deposited by a decomposition of tetraethylorthosilicate to form a predetermined thickness of tunneling oxide on the surface of the polysilicon. The oxide layer formed from the deposited tetraethylorthosilicate is then thermally annealed and densified. Preferably, this is performed using a mixture of steam and an inert gas, such as argon, at a predetermined temperature. The process may be repeated where more than one tunneling layer is desired. Where necessary, prior to depositing the tetraethylorthosilicate, where enhanced emission structures are desired on the surface of the polysilicon, a layer of relatively thin oxide thermal oxide may be grown on the surface of the polysilicon.

Accordingly, it is an object of the present invention to provide a tunneling oxide in an EEPROM device which may be deposited with a low pressure chemical vapor deposition process.

It is another object of the present invention to improve the useful lifetime of an EEPROM device.

It is yet another object of the present invention to improve the yield in EEPROM processing.

It is another object of the present invention to improve the reliability of an EEPROM device.

It is yet another object of the present invention to produce a tunneling dielectric that is not limited by the underlying defect density of the material on which the oxide layer is being formed.

It is yet another object of the present invention to produce a tunneling dielectric having minimum stress.

BRIEF DESCRIPTION OF THE DRAWING

These and other objects will be apparent through the description below and the accompanying drawings in which.

DETAILED DESCRIPTION OF THE INVENTION

Figure 1:
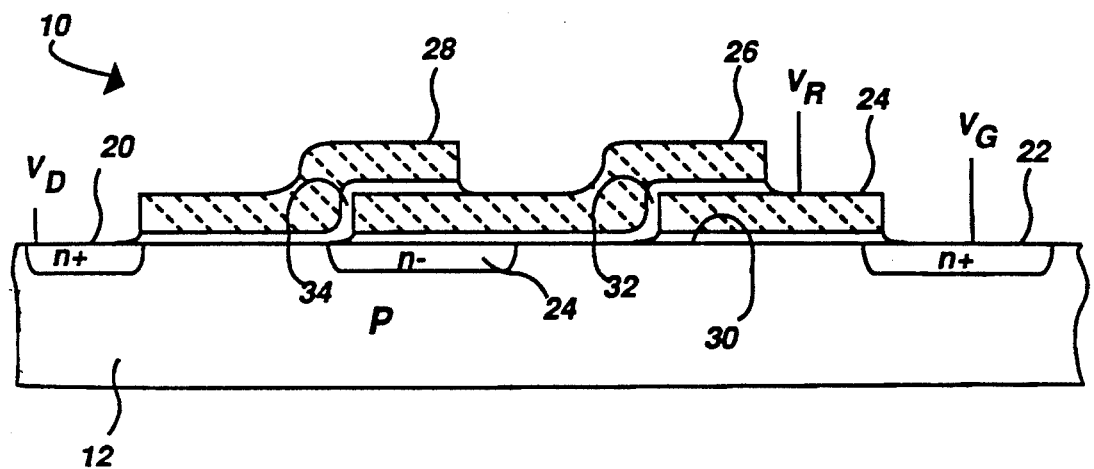
FIG. 1 is a cutaway view of a three layer thick-oxide EEPROM device constructed in accordance with the present invention.

Referring now to FIG. 1, there is shown a cutaway view of a three layer polysilicon device which may advantageously employ the tunneling oxide layer of the present invention. The operation and manufacture of the device of FIG. 1 is substantially described in U.S. Pat. No. 4,599,706, the difference being the substitution of the present deposited oxide for the thermal oxide described in the above U.S. patent.

The EEPROM device 10 of FIG. 1 is formed on a substrate 12 which comprises a "p"-type semiconductor material. Two n+ regions 20, 22 are diffused on opposing ends of the substrate. An n− region 24 is diffused in a central upper region of substrate 12. The n+ source, drain regions 20, 22 and n− diffusion 24 may be formed using a conventional well known diffusion process. The EEPROM device 10 further includes a polysilicon electrode 24 which is isolated from substrate 12 by oxide region 30 and polysilicon electrodes 26 and 28 which are separated from the substrate, and each other by tunneling oxide regions or elements 32 and 34. In prior EEPROM devices, the oxide used for forming these tunneling elements 32, 34 was thermally grown, which is believed to cause stress and defects in tunneling oxide elements 32, 34 because defects from the underlying silicon substrate or polysilicon region may propagate into the tunneling oxide.

The present invention contemplates the use of a low pressure chemical vapor deposition process to form elements 32, 34. In a thermal oxidation process, once the tunneling oxides are grown, subsequent thermal processing causes thermal stress in the oxide, thus causing additional breakdown and charge trap-up problems in the device. The present invention contemplates the use of a low temperature process to minimize thermal oxide growth during the processing of the device, which significantly reduces stress and thereby increases the useful life of the device. This feature has also been found to enhance electron tunneling in the resulting device. Furthermore, the low pressure chemical vapor deposition process used according to the present invention for forming an oxide layer is believed to avoid the propagation of defects into the oxide from the underlying substrate or polysilicon.

Atmospheric deposition of silicon has been attempted in the past using silicon rich $SiO_2$ in a chemical vapor deposition process. One such process is described in an article entitled "Silicon-Rich $SiO_2$ and Thermal $SiO_2$ Dual Dielectric for Yield Improvement and High Capacitance", IEEE Transactions on Electron Devices, Vol. ED-30, No. 8, P. 894, August 1983. The process described in this publication is experimental and has been found to be inadequate for use in manufacturing tunneling oxides because silicon rich $SiO_2$ is not a stoichiometric compound and thus contains impurities which affect the uniformity of the deposited oxide. The use of an atmospheric deposition also creates large variations in thickness of the resulting layer and, therefore, silicon rich $SiO_2$ has only been used for relatively thick layers. Furthermore, although the added silicon in the above process provides a form of enhancement for electron tunneling through the dielectric formed by this process, it's not as efficient as the formation of a textured surface on the underlying silicon substrate or polysilicon conductive layer. This is because the silicon rich $SiO_2$ apparently forms regions or balls of silicon in the silicon dioxide near the surface thereof but spread out. Thus, they are not conductive with each other or with the surface of the dielectric and so are less efficient as enhanced emission structures as compared with the textured surface of a polysilicon layer.

Other commonly used deposited oxide processes have been developed in the past for forming oxide layers between metal layers in the range of 0.5 microns to several microns or for filling trenches. However, these processes have been found to be inadequate for forming thinner layers (on the order of 2000 or less Angstroms) such as are required for tunneling oxide elements, because these processes have poor uniformity and suffer from low breakdown voltages at such thicknesses. One such process employs tetraethylorthosilicate (TEOS) which is available from the J. C. Schumacher Co. and has typically been used for thick oxide processes. This material is also called tetraethyloxysilane.

The present invention overcomes the above problem by modifying the known deposited oxide process using a densification or annealing step on the TEOS deposited oxide during processing. It has been found that by exposing the TEOS deposited oxide to a steam and inert gas mixture at a relatively high temperature, the properties of the TEOS oxide are modified to equal or exceed those of thermally grown oxides. The resulting material has substantially improved dielectric properties and the resulting material is substantially free of leakage and does not break down in the presence of a strong electric field. It is believed that this annealing process provides more uniform molecular bonding by permitting greater viscous flow in the TEOS deposited oxide thus reducing or eliminating defects in the resulting dielectric layer. Since this steam ambient at the desired annealing temperature grows oxide at a relatively fast rate, which would thereby increase the thickness of the dielectric layer, the inert gas provides a partial pressure which is used to slow this undesired oxide growth rate while allowing the annealing process to proceed. The process of the present invention has been found to increase the total charge conducted through the dielectric layer by at least one order of magnitude before catastrophic breakdown, while at the same time providing a dramatic improvement in processing yields.

Figure 2A:
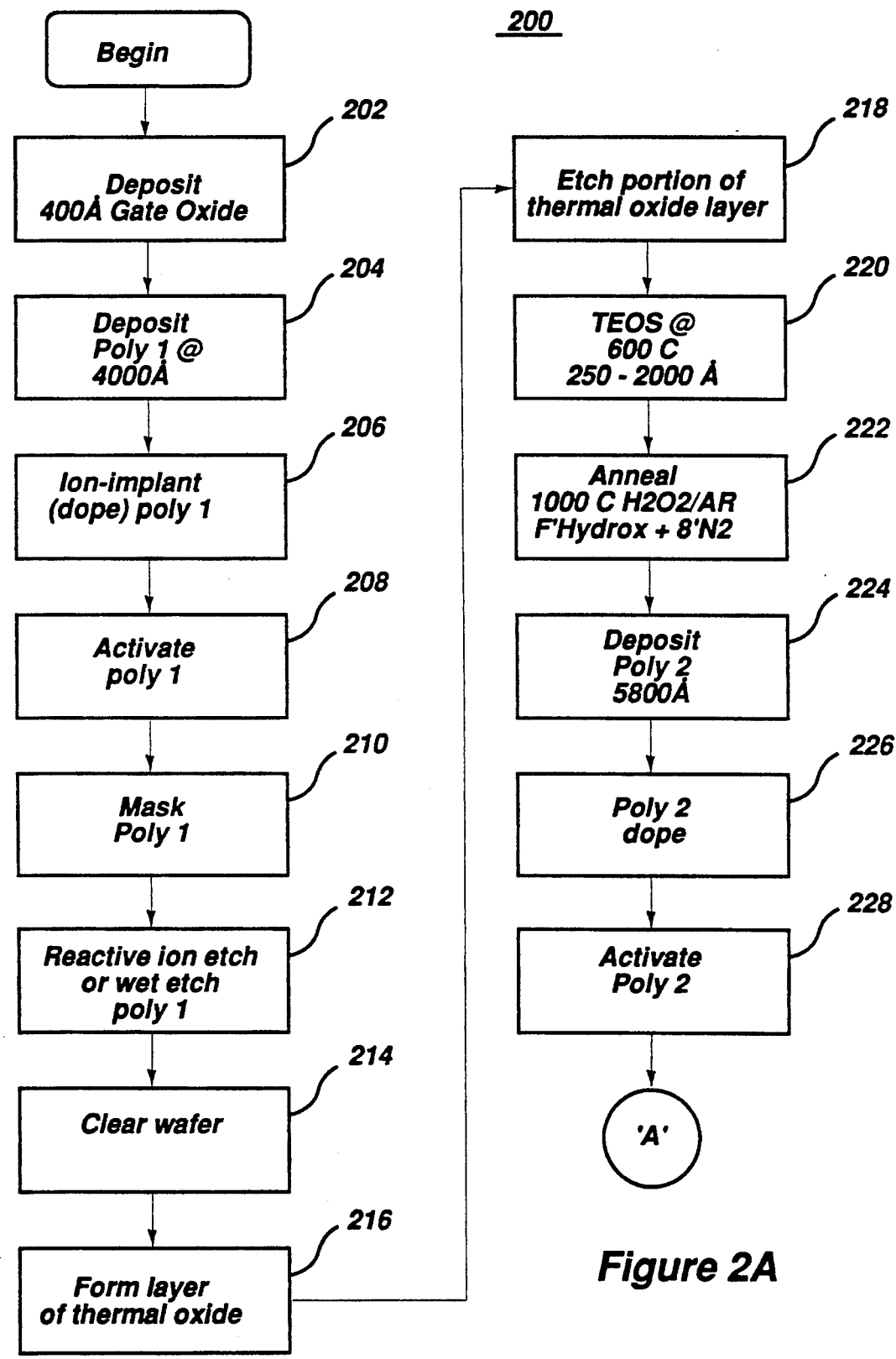
FIGS. 2A and 2B are flow diagrams detailing a process for manufacturing one of the tunneling oxide regions of the device of FIG. 1.
Figure 2B:
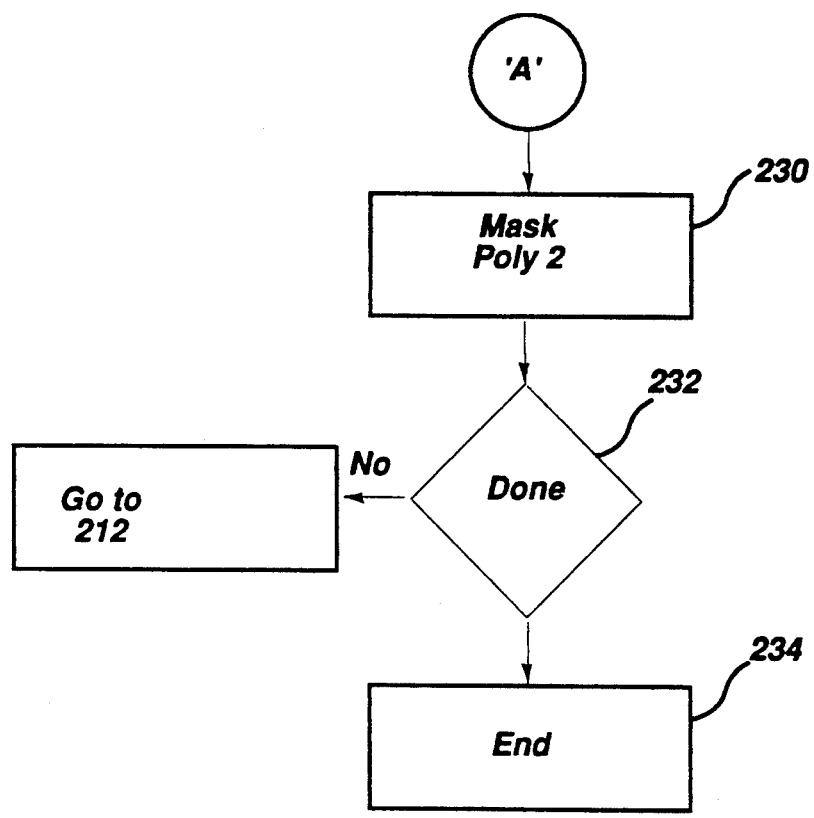

Referring now to FIGS. 2A and 2B, the process 200 begins with step 202 wherein an initial layer of gate oxide, approximately 400 Angstroms thick is deposited on a substrate. This oxide layer may be formed with a conventional thermal oxide process. In step 204 the first layer of polysilicon is formed with a conventional polysilicon deposition process. The first layer of polysilicon is deposited approximately 4000 Angstrons thick. In step 206, the first layer of polysilicon is doped to render the polysilicon layer conductive. The first layer of polysilicon may then be masked in step 210 and etched in step 212 using either a reactive ion etch or wet etch process. In the preferred practice of the present invention, it is desirable that the surface of each tunneling region be somewhat irregular to promote electron tunneling. These surface irregularities or microtextured surfaces are formed by thermally oxidizing the surface of the polysilicon layer with step 216. The thermal oxide of step 216 is then etched back to leave a layer of oxide approximately 150 Angstroms thick. The tunneling oxide layer is then formed by steps 220 and 222. In step 220, oxide is deposited over the relatively thin layer of thermal oxide using a low pressure chemical vapor deposition system with TEOS as the preferred gaseous medium. The TEOS gas is supplied via a bubbler by direct pull with the furnace temperature at approximately 600° C. The deposition rate is controlled primarily by the bubbler and furnace temperatures. The oxide is deposited to create an oxide layer of between 250 and 2000 Angstroms thick. This oxide layer is then annealed in step 222.

The annealing process of step 222 is done by exposing the TEOS produced silicon dioxide layer to a gaseous mixture of steam and argon at a temperature range of approximately 700°-1100° C. for approximately 1-5 minutes. This is preferably followed by further thermal annealing in a solely nitrogen ambient to prevent further oxidation of the surface. This is performed at the same approximate temperature range for between 2 and 20 minutes. Other annealing processes, such as rapid optical annealing may also be employed at different temperatures and timing as is known in the art for thick deposited oxide layers. The process is continued at step 224 wherein the next layer of polysilicon, approximately 400014 6000 Angstroms thick, is deposited by conventional means. The second layer of polysilicon is then doped in step 226. The second layer of polysilicon is then masked for further processing in step 230. Depending on whether additional layers of polysilicon are required, decision 232 either routes the process back to step 212 or exits the process at step 234. The resulting structure may then be metalized and finished according to conventional means.

In summary, an improved method and means for making a tunneling oxide using TEOS deposited silicon dioxide has been described. Accordingly, other uses and modifications will be apparent to a person of ordinary skill in the art without departing from the scope of the present invention.

What is claimed is:

1. A method of manufacturing a tunneling oxide comprising the steps of:

forming a conductive region serving as a source of tunneling electrons;

depositing an electron tunneling layer over said conductive region, said tunneling layer comprising a layer of silicon dioxide formed using a low pressure chemical vapor deposition process comprising the use of a tetraethylorthosilicate vapor at a temperature between 450° and 1000° C. to form a layer of a thickness of less than 2000 Angstroms;

annealing and silicon dioxide layer; and thereafter forming a conductive layer serving as a receptor of tunneling electrons on top of said silicon dioxide layer such that when a bias is applied between said conductive region and said conductive layer, electron tunneling will occur from said conductive region to said conductive layer through said silicon dioxide layer.

2. The method of claim 1 wherein said annealing step comprises the step of exposing said silicon dioxide layer to a mixture of steam and an inert gas at a temperature of between 700° C. and 1100° C.

3. The method of claim 2 further comprising the step of thermally annealing said silicon dioxide layer in a solely nitrogen ambient at a temperature of between 700° C. and 1100° C. for between two to twenty minutes.

4. The method of claim 1 wherein the silicon dioxide layer is deposited at a temperature of approximately 600° C.

5. A method of making an EEPROM device comprising the steps of:

(a) depositing a layer of conductive material in a desired pattern, said conductive material serving as a source of tunneling electrons for programming said EEPROM device;

(b) depositing a tunneling layer of silicon dioxide through which tunneling electrons travel when said EEPROM device is programmed, said tunneling layer being deposited over said conductive material to a thickness of less than 2000 Angstroms using a low pressure chemical vapor deposition process comprising the use of tetraethylorthosilicate, said silicon dioxide layer being thereby substantially defect-free;

(c) annealing said silicon dioxide layer with a mixture of steam and an inert gas; and (d) forming a conductive layer on top of said silicon dioxide tunneling layer, said conductive layer serving as a receptor of tunneling electrons when said EEPROM device is programmed.

6. A method of depositing a relatively thin tunneling dielectric in a semiconductor device comprising the steps of:

(a) forming a conductive region;

(b) thermally growing a relatively thin layer of tunneling oxide over said conductive region such that said conductive region forms a microtextured surface for promoting electron tunneling;

(c) depositing a layer of tunneling silicon dioxide over said thermal oxide layer to a thickness less than 2000 Angstroms using a low pressure chemical vapor deposition process comprising the use of tetraethylorthosilicate; and (d) forming a conductive layer on top of said layer of silicon dioxide.

7. The method of claim 6 further including annealing said deposited silicon dioxide layer with a mixture of steam and an inert gas at a predetermined temperature.

8. The method of claim 6 wherein the thermally grown oxide layer is approximately 150 Angstroms thick.

9. A method of depositing tunneling oxide in an EEPROM device comprising the steps of:

(a) forming a layer of polysilicon in a desired pattern, said layer of polysilicon having a microtextured surface for promoting electron tunneling;

(b) depositing a layer of tunneling silicon dioxide over said polysilicon layer to a thickness of less than 2000 Angstroms using a low pressure chemical vapor deposition process comprising the use of tetraethylorthosilicate;

(c) annealing said silicon dioxide layer with a mixture of steam and an inert gas; and (d) forming a layer of polysilicon on top of said silicon dioxide layer.

10. The method of claim 9 wherein said silicon dioxide layer is deposited using tetraethylorthosilicate at a temperature of between 450° and 1000° C.

11. A method of depositing tunneling oxide in an EEPROM device comprising the steps of:

(a) forming a layer of polysilicon in a desired pattern;

(b) growing a layer of thermal oxide over said layer of polysilicon such that said layer of polysilicon forms a microtextured surface for promoting electron tunneling;

(c) etching said layer of thermal oxide to provide a thermal oxide layer of a desired thickness;

(d) depositing a layer of tunneling silicon dioxide over said etched layer of thermal oxide in a thickness less than 2000 Angstroms thick with a low pressure chemical vapor deposition process using tetraethylorthosilicate as the gaseous medium;

(e) annealing and densifying said layer of silicon dioxide by exposing said layer of silicon dioxide to a mixture of steam and an inert gas at a temperature of between 700° and 1100° C.;

(f) further annealing said layer of silicon dioxide by exposing said layer of silicon dioxide to nitrogen at a temperature of between 700° and 1100° C.; and (g) forming a layer of polysilicon on top of said silicon dioxide layer.

12. The method of claim 11 wherein the thermally grown oxide layer is approximately 150 Angstroms thick after said step of etching.

13. The method of claim 11 wherein said thermally grown oxide layer is relatively thin in comparison to said low pressure chemical vapor deposited silicon dioxide layer.

14. The method of claim 11 wherein said inert gas is argon.

* * * * *